United States Patent
Tu et al.

(10) Patent No.: US 8,769,188 B2
(45) Date of Patent: Jul. 1, 2014

(54) NONVOLATILE MEMORY CONTROLLER AND METHOD FOR WRITING DATA TO NONVOLATILE MEMORY

(75) Inventors: Li-Chun Tu, Taipei (TW); Chao-Yi Wu, Kaohsiung County (TW); Ping-Sheng Chen, Chiayi County (TW)

(73) Assignee: Mediatek Inc., Hsin-Chu (TW)

( * ) Notice: Subject to any disclaimer, the term of this patent is extended or adjusted under 35 U.S.C. 154(b) by 679 days.

(21) Appl. No.: 12/620,722

(22) Filed: Nov. 18, 2009

(65) Prior Publication Data

US 2011/0119429 A1    May 19, 2011

(51) Int. Cl.
   *G06F 11/00*      (2006.01)
   *H03M 13/09*      (2006.01)
   *G06F 3/06*       (2006.01)

(52) U.S. Cl.
   CPC ............ *H03M 13/09* (2013.01); *H03M 13/096* (2013.01); *G06F 3/0679* (2013.01)
   USPC ............ 711/103; 714/758; 714/766; 714/819

(58) Field of Classification Search
   CPC .... G06F 3/0679; H03M 13/09; H03M 13/096
   USPC ............................ 711/103; 714/758, 766, 819
   See application file for complete search history.

(56) References Cited

U.S. PATENT DOCUMENTS

| | | | |
|---|---|---|---|
| 5,428,630 A | 6/1995 | Weng et al. | |
| 5,638,386 A | 6/1997 | Tsunoda et al. | |
| 5,754,567 A | 5/1998 | Norman | |
| 5,956,743 A | 9/1999 | Bruce et al. | |
| 5,958,079 A | 9/1999 | Yoshimura | |
| 6,282,689 B1 | 8/2001 | Seyyedy | |
| 6,725,414 B2 | 4/2004 | Seyyedy | |
| 7,111,140 B2 | 9/2006 | Estakhri | |
| 2003/0089786 A1 | 5/2003 | Bringer et al. | |
| 2009/0024787 A1* | 1/2009 | Yim .............................. | 711/103 |
| 2010/0318887 A1* | 12/2010 | Zvibel ........................... | 714/819 |
| 2011/0041039 A1* | 2/2011 | Harari et al. .................. | 714/773 |
| 2011/0055468 A1* | 3/2011 | Gonzalez et al. ............. | 711/103 |
| 2011/0296082 A1 | 12/2011 | Guan | |

FOREIGN PATENT DOCUMENTS

| | | |
|---|---|---|
| CN | 1398404 | 2/2003 |
| CN | 101419838 | 4/2009 |

* cited by examiner

*Primary Examiner* — Than Nguyen
(74) *Attorney, Agent, or Firm* — McClure, Qualey & Rodack, LLP

(57) ABSTRACT

The invention provides a nonvolatile memory controller. In one embodiment, the nonvolatile memory controller receives new data for writing a nonvolatile memory from a host, and comprises a signature calculating circuit, a signature buffer, a signature comparison circuit, a data comparison circuit, and a nonvolatile memory interface circuit. The signature calculating circuit calculates a first signature according to the new data. The signature buffer outputs a second signature corresponding to old data stored in the nonvolatile memory, wherein the old data has the same logical address as that of the new data. The signature comparison circuit determines whether the first signature is identical to the second signature. The nonvolatile memory interface circuit writes the new data to the nonvolatile memory when the first signature is determined to be different from the second signature by the signature comparison circuit.

24 Claims, 11 Drawing Sheets

NONVOLATILE MEMORY CONTROLLER AND METHOD FOR WRITING DATA TO NONVOLATILE MEMORY

BACKGROUND OF THE INVENTION

1. Field of the Invention

The invention relates to nonvolatile memory controller, and more particularly to data writing control of nonvolatile memory memories.

2. Description of the Related Art

Nonvolatile memory memories are non-volatile memories that can be electrically erased and reprogrammed. Nonvolatile memory memories are primarily used in memory cards and USB nonvolatile memory drives for general storage and transfer of data between computers and other digital products. Referring to FIG. 1, a schematic diagram of a host 102 and a nonvolatile memory device 104 storing data for the host 102 is shown. In one embodiment, the host 102 is a computer. The nonvolatile memory device 104 comprises a nonvolatile memory controller 112 and a nonvolatile memory 114. The nonvolatile memory controller 112 acts as an interface between the host 102 and the nonvolatile memory 114 and accesses data stored in the nonvolatile memory 114 for the host 102. When the host 102 wants to store data to the nonvolatile memory device 104, the host 102 transfers data to the nonvolatile memory controller 112, and the nonvolatile memory controller 112 writes the data received from the host 102 to the nonvolatile memory 114. When the host 102 wants to retrieve data from the nonvolatile memory device 104, the nonvolatile memory controller 112 retrieves data from the nonvolatile memory 114 and delivers the retrieved data to the host 102.

The nonvolatile memory device 104 stores data for the host 102. The host 102 therefore may retrieve original data from the nonvolatile memory device 104, slightly amend the original data to obtain new data, and store the new data back to the nonvolatile memory device 104. In the situation, only an amended portion of the new data is different from the original data, and an unchanged portion of the new data and is therefore the same as the original data. A conventional nonvolatile memory controller 112, however, does not differentiate the unchanged data portion from the amended data portion, and directly writes all new data to the nonvolatile memory 114. Because writing of the unchanged data portion requires an extra time period, the whole data writing process is delayed, and performance of the nonvolatile memory device 104 is degraded. In addition, because the unchanged data portion is written twice to the nonvolatile memory 114, a life span of the nonvolatile memory 114 is shortened due to unnecessary duplication of the unchanged data portion.

To avoid the aforementioned disadvantages, a method for writing data to a nonvolatile memory is provided. Referring to FIG. 2, a flowchart of a method 200 for writing data to a nonvolatile memory 114 is shown. The nonvolatile memory controller 112 first receives new data from the host 102 at step 202, and calculates a first error correction code according to the new data at step 203. The nonvolatile memory controller 112 then reads a second error correction code of old data from the nonvolatile memory 114 at step 204, wherein the old data has the same logical address as that of the new data. The nonvolatile memory controller 112 then compares the first error correction code with the second error correction code at step 206. When the first error correction code is identical to the second error correction code at step 208, the new data is determined to be an unchanged data portion and is not written to the nonvolatile memory 114. On the contrary, when the first error correction code is not identical to the second error correction code at step 208, the new data is determined to be an amended data portion, and the nonvolatile memory controller 112 writes the new data to the nonvolatile memory at step 210. If the host 102 sends more new data to the nonvolatile memory controller 112, the nonvolatile memory controller 112 repeats the steps 202~210 again until all data sent by the host 102 is processed.

The method 200 can differentiate a portion of unchanged data from amended data, thus reducing duplication of unchanged data. The method 200, however, still has disadvantages. First, the nonvolatile memory controller 112 has to read an error correction code of the old data from the nonvolatile memory 114, thus extending a time period required by an entire data writing process and degrading performance of the nonvolatile memory device 104. In addition, even if the old data is different from the new data, the second error correction code of the old data may be the same as the first error correction code of the new data. The nonvolatile memory controller 112 therefore may erroneously skip writing of the new data to the nonvolatile memory 114 according to comparison of the first error correction code and the second error correction code. A new method for writing data to a nonvolatile memory is therefore required.

BRIEF SUMMARY OF THE INVENTION

The invention provides a nonvolatile memory controller. In one embodiment, the nonvolatile memory controller receives new data for writing a nonvolatile memory from a host, and comprises a signature calculating circuit, a signature buffer, a signature comparison circuit, a data comparison circuit, and a nonvolatile memory interface circuit. The signature calculating circuit calculates a first signature according to the new data. The signature buffer stores a plurality of signatures corresponding to data stored in the nonvolatile memory, and outputs a second signature corresponding to old data stored in the nonvolatile memory, wherein the old data has the same logical address as that of the new data. The signature comparison circuit determines whether the first signature is identical to the second signature. The data comparison circuit determines whether the new data is the same as the old data when the first signature is identical to the second signature. The nonvolatile memory interface circuit writes the new data to the nonvolatile memory when the first signature is determined to be different from the second signature by the signature comparison circuit or when the new data is determined to be different from the old data by the data comparison circuit.

The invention provides a method for writing new data to a nonvolatile memory. First, the new data is received from a host. A first signature is then calculated according to the new data. A second signature corresponding to old data stored in the nonvolatile memory is then obtained, wherein the old data has the same logical address as that of the new data. Whether the first signature is identical to the second signature is then determined. When the first signature is identical to the second signature, whether the new data is the same as the old data is also determined. When the first signature is determined to be different from the second signature or when the new data is determined to be different from the old data, the new data is written to the nonvolatile memory.

The invention provides a nonvolatile memory controller. In one embodiment, the nonvolatile memory controller receives new data for writing a nonvolatile memory from a host, and comprises a signature calculating circuit, a signature buffer, a signature comparison circuit, and a nonvolatile memory interface circuit. The signature calculating circuit calculates a first signature according to the new data. The signature buffer stores a plurality of signatures corresponding to data stored in the nonvolatile memory, and outputs a second signature corresponding to old data stored in the nonvolatile memory, wherein the old data has the same logical address as that of the new data. The signature comparison circuit determines whether the first signature is identical to the second signature. The nonvolatile memory interface circuit writes the new data to the nonvolatile memory when the first signature is determined to be different from the second signature by the signature comparison circuit.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
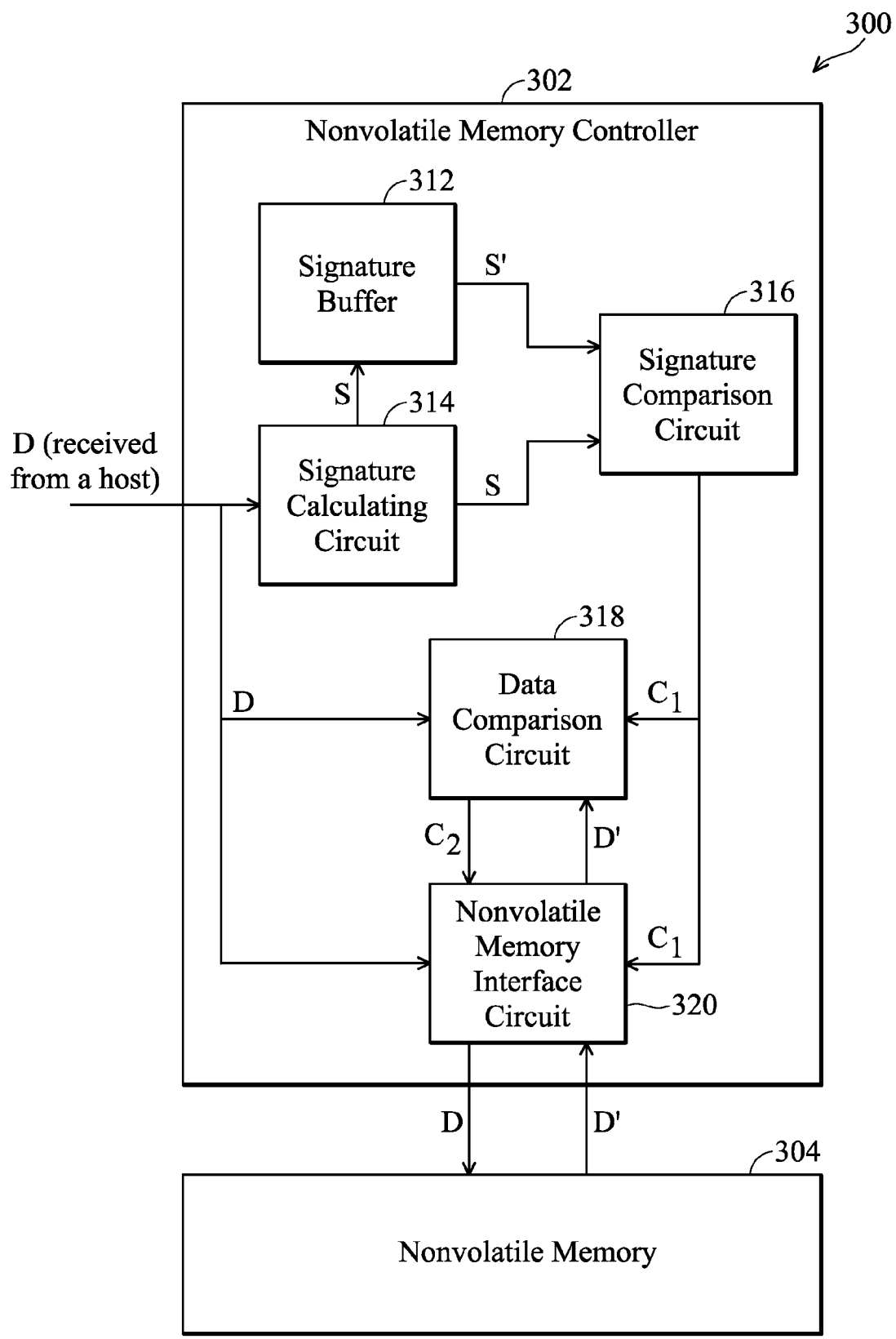
FIG. 3 is a block diagram of a memory device according to the invention.

Referring to FIG. 3, a block diagram of a memory device 300 according to the invention is shown. The memory device 300 stores data for a host and comprises a nonvolatile memory controller 302 and a nonvolatile memory 304. The nonvolatile memory controller 302 controls data reading and writing between the host and the nonvolatile memory 304. When the host wants to retrieve data from the memory device 300, the nonvolatile memory controller 302 retrieves data from the nonvolatile memory 304 and delivers the retrieved data to the host. When the host wants to store data to the memory device 300, the host transfers data to the nonvolatile memory controller 302, and the nonvolatile memory controller 302 determines the way for writing the data received from the host to the nonvolatile memory 304.

Figure 4:
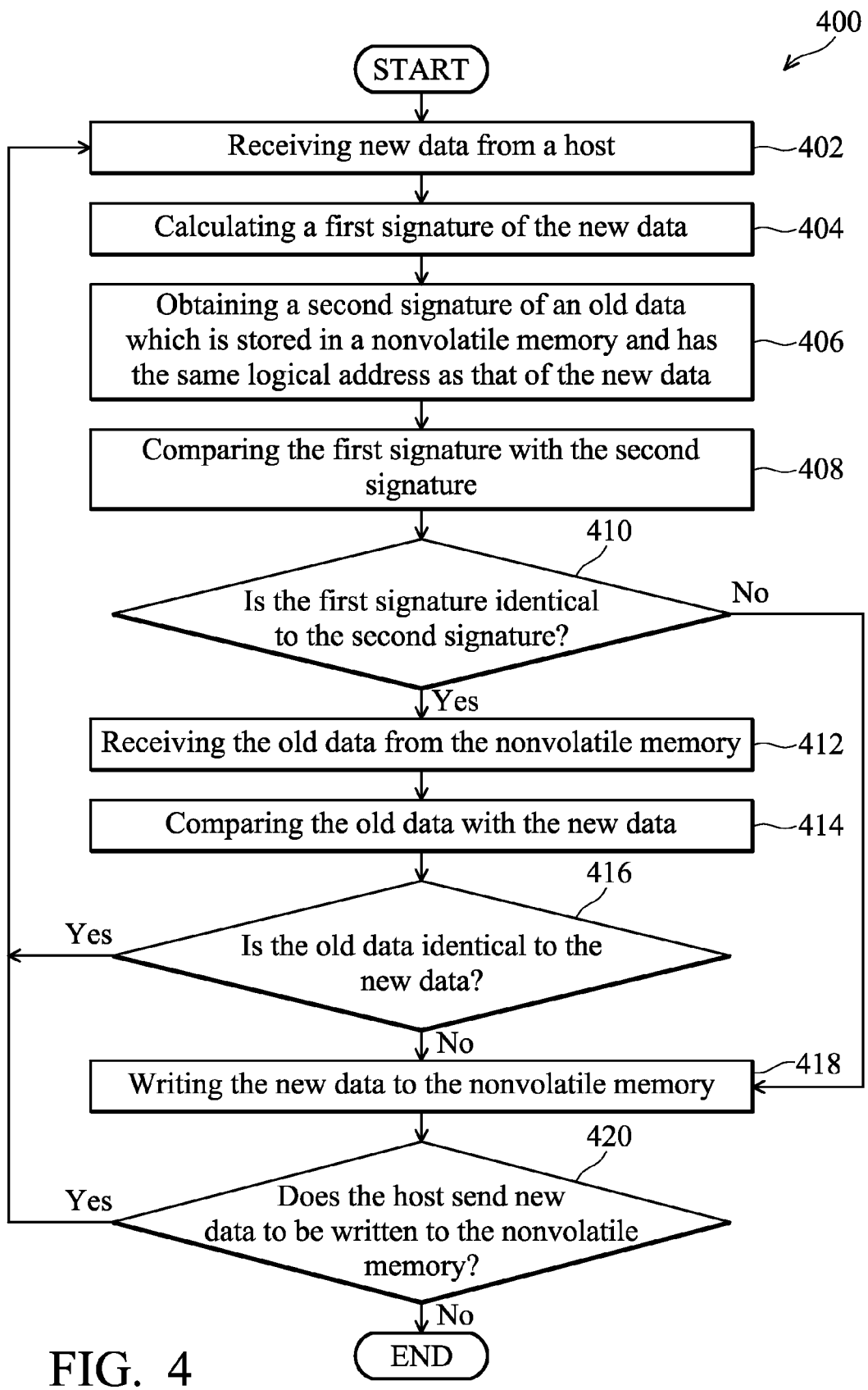
FIG. 4 is a flowchart of a method for writing new data to a nonvolatile memory according to the invention.

When the host wants to write new data to the nonvolatile memory 304, the new data may be generated by amending old data previously stored in the nonvolatile memory 304, and a large unchanged portion of the new data may be the same as the old data stored in the nonvolatile memory 304. The nonvolatile memory controller 302 therefore identifies the unchanged data portion of the new data to avoid duplication of the unchanged data portion. Referring to FIG. 4, a flowchart of a method 400 for writing new data to a nonvolatile memory 304 according to the invention is shown. The nonvolatile memory controller 302 operates according to the method 400 to determine whether to write new data to the nonvolatile memory 304.

In one embodiment, the nonvolatile memory controller 302 comprises a signature buffer 312, a signature calculating circuit 314, a signature comparison circuit 316, a data comparison circuit 318, and a nonvolatile memory interface circuit 320. The signature buffer 312 stores a plurality of signatures corresponding to data stored in the nonvolatile memory 304. Each signature is derived from corresponding data stored in the nonvolatile memory 304 and used as an identity of the corresponding data. Signatures corresponding to different data have a low probability to be identical. The nonvolatile memory controller 302 therefore can roughly determine whether new data received from the host is different from old data stored in the nonvolatile memory 304. In one embodiment, the signatures are checksums of corresponding data stored in the nonvolatile memory 304. In another embodiment, the signatures are error correction codes of corresponding data stored in the nonvolatile memory 304.

When the memory device 300 receives new data D from a host (step 402), the nonvolatile memory controller 302 calculates a first signature S according to the new data D (step 404). The signature buffer 312 then outputs a second signature S' corresponding to old data D' stored in the nonvolatile memory 304 (step 406), wherein the old data D' has the same logical address as that of the new data D. In one embodiment, the signature buffer 312 stores signatures according to logical addresses of corresponding data stored in the nonvolatile memory 304. When the nonvolatile memory controller 302 receives the new data D, the signature buffer 312 therefore can selects the second signature S' corresponding to the old data D' from the signatures stored therein according to a logical address of the new data D, and then outputs the second signature S'.

The signature comparison circuit 316 then compares the first signature S with the second signature S' to determine whether the first signature S is identical to the second signature S' (step 408). When the first signature S is different from the second signature S'(step 410), the new data D must be different from the old data D', and the signature comparison circuit 316 sends a comparison result signal $C_1$ to direct the nonvolatile memory interface circuit 320 to write the new data D to the nonvolatile memory 304 (step 418). When the first signature S is identical to the second signature S' (step 410), although the new data D has a large probability to be the same as the old data D', the new data D still has little chance to be different from the old data D'. The nonvolatile memory controller 302 therefore has to physically compare the new data D with the old data D'.

The signature comparison circuit 316 therefore sends a comparison result $C_1$ to direct the nonvolatile memory interface circuit 320 to read the old data D' from the nonvolatile memory 304 (step 412). The nonvolatile memory interface circuit 320 then delivers the old data D' to the data comparison circuit 318, and the data comparison circuit 318 compares the new data D with the old data D' to determine whether the new data D is the same as the old data D' (step 414). When the new data D is the same as the old data D' (step 416), writing of the new data D is skipped to avoid data duplication, thus reducing a required time period of an entire data writing process and extending a durable lifespan of the nonvolatile memory 304. When the new data D is different from the old data D' (step 416), the data comparison circuit 318 generates a comparison result signal $C_2$ to direct the nonvolatile memory interface circuit 320 to write the new data D to the nonvolatile memory 304 (step 418). Thus, only when the first signature S is determined to be different from the second signature S' by the signature comparison circuit 316 or when the new data D is determined to be different from the old data S' by the data comparison circuit 318, then the nonvolatile memory interface circuit 320 would write the new data D to the nonvolatile memory 304. The nonvolatile memory controller 302 continues to perform steps 402-418, only when the host continues to send new data to be written to the nonvolatile memory 304.

Figure 1:
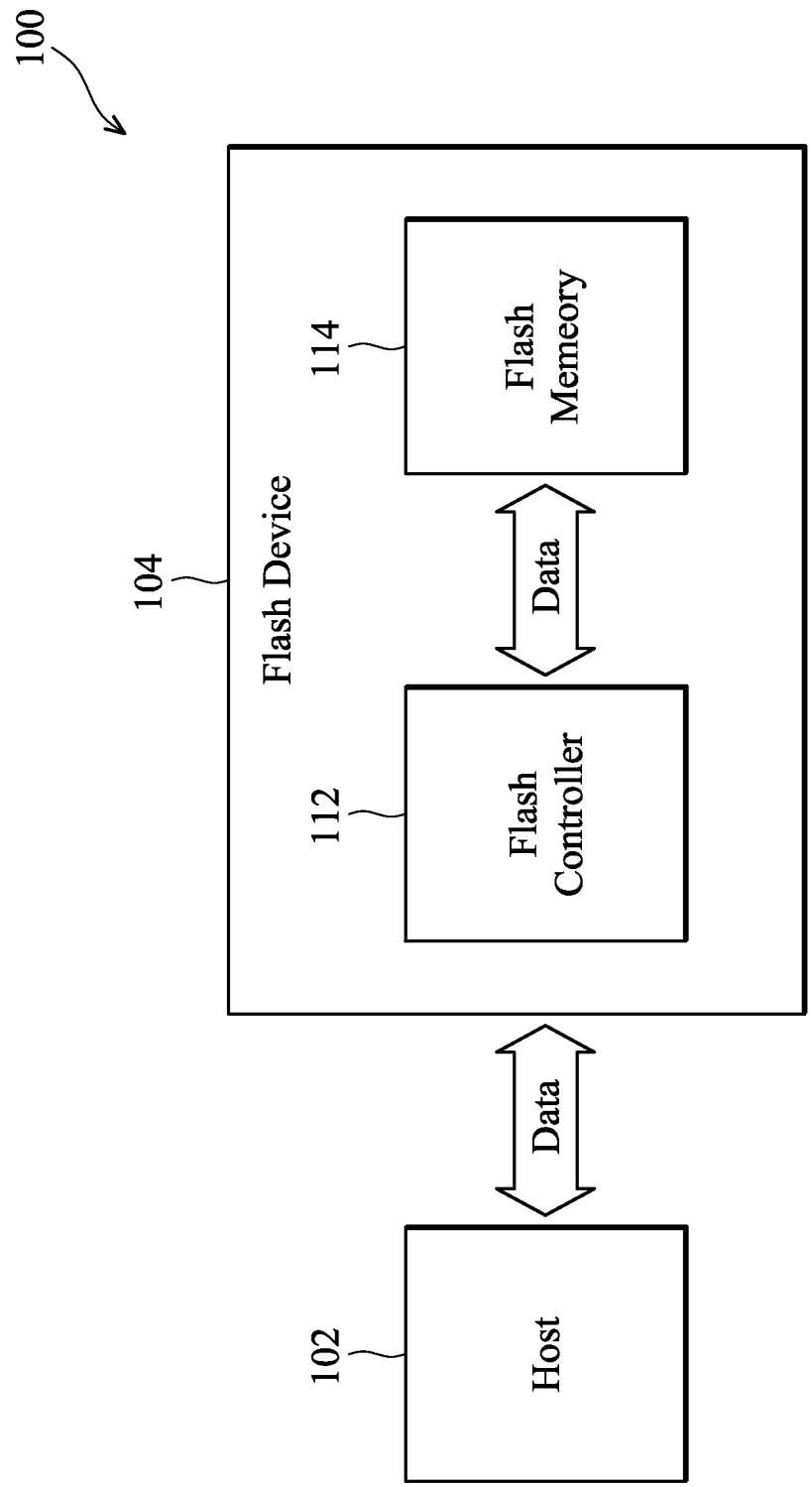
FIG. 1 is a schematic diagram of a host and a memory device storing data for the host.
Figure 2:
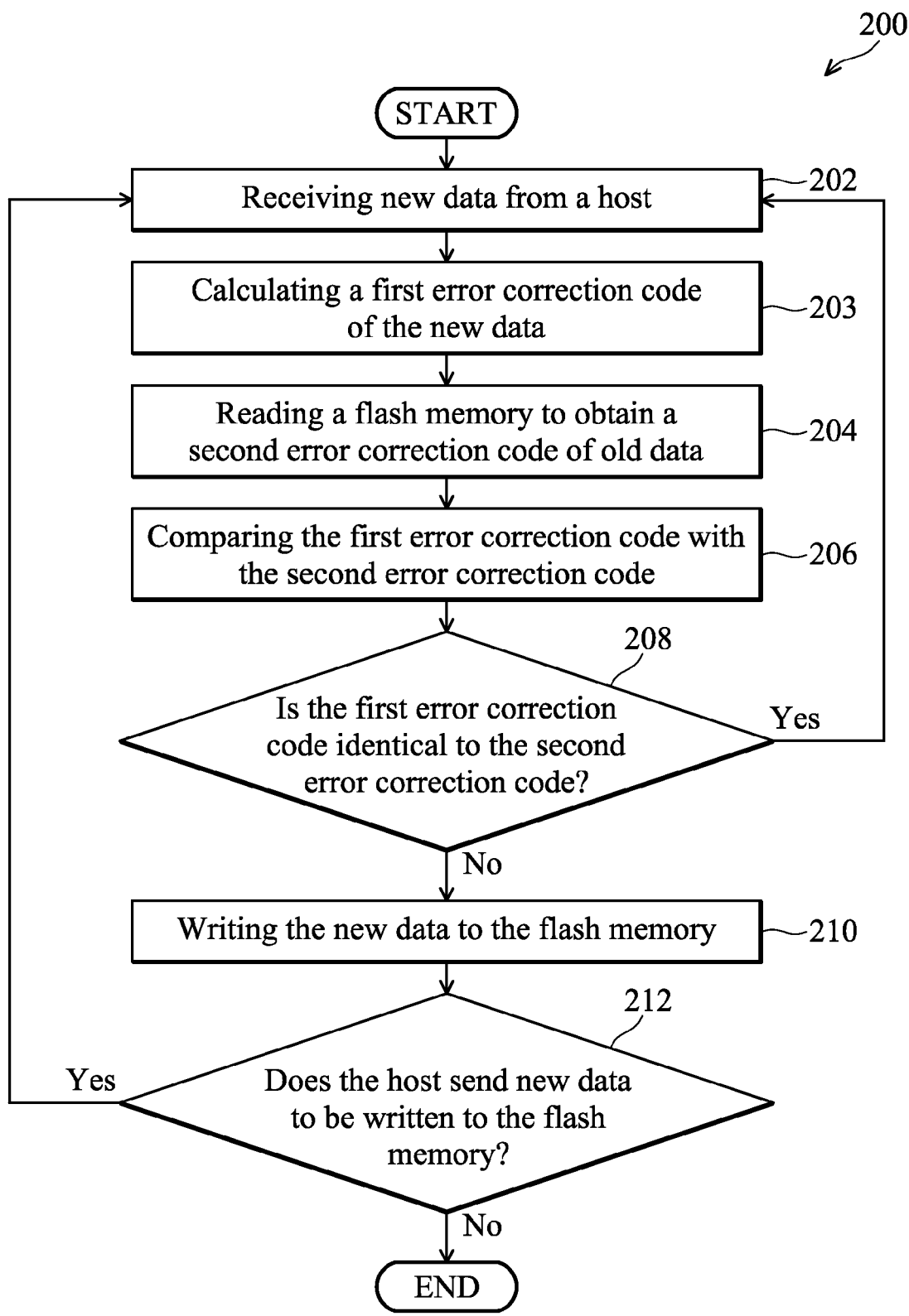
FIG. 2 is a flowchart of a conventional method for writing data to a nonvolatile memory.

In one embodiment, after the nonvolatile memory interface circuit 320 writes the new data D to the nonvolatile memory 304, the first signature S calculated by the signature calculating circuit 314 is stored into the signature buffer 312 according to the logical address of the new data D. Thus, all data stored in the nonvolatile memory 304 has corresponding signatures stored in the signature buffer 312. Compared with the method 200 shown in FIG. 2, the nonvolatile memory controller 302 stores signatures of corresponding old data in the signature buffer 312. When the nonvolatile memory controller 302 receives new data D from the host, the nonvolatile memory controller 302 directly retrieves a signature S' of the old data D' from the signature buffer 312 and compares a signature S of the new data D with the signature S' of the old data D' instead of reading old data D' from the nonvolatile memory 304. Thus, a required time period of an entire data writing process is reduced, thus improving performance of the memory device 300. In addition, if the old data is different from the new data, an error correction code of the old data may be the same as an error correction code of the new data, and the conventional method 200 would erroneously skips writing of the new data. The nonvolatile memory controller 302, however, compares the new data D and the old data D' when the signatures S and S' are the same, thus avoiding erroneous skipping of data writing.

Figure 5:
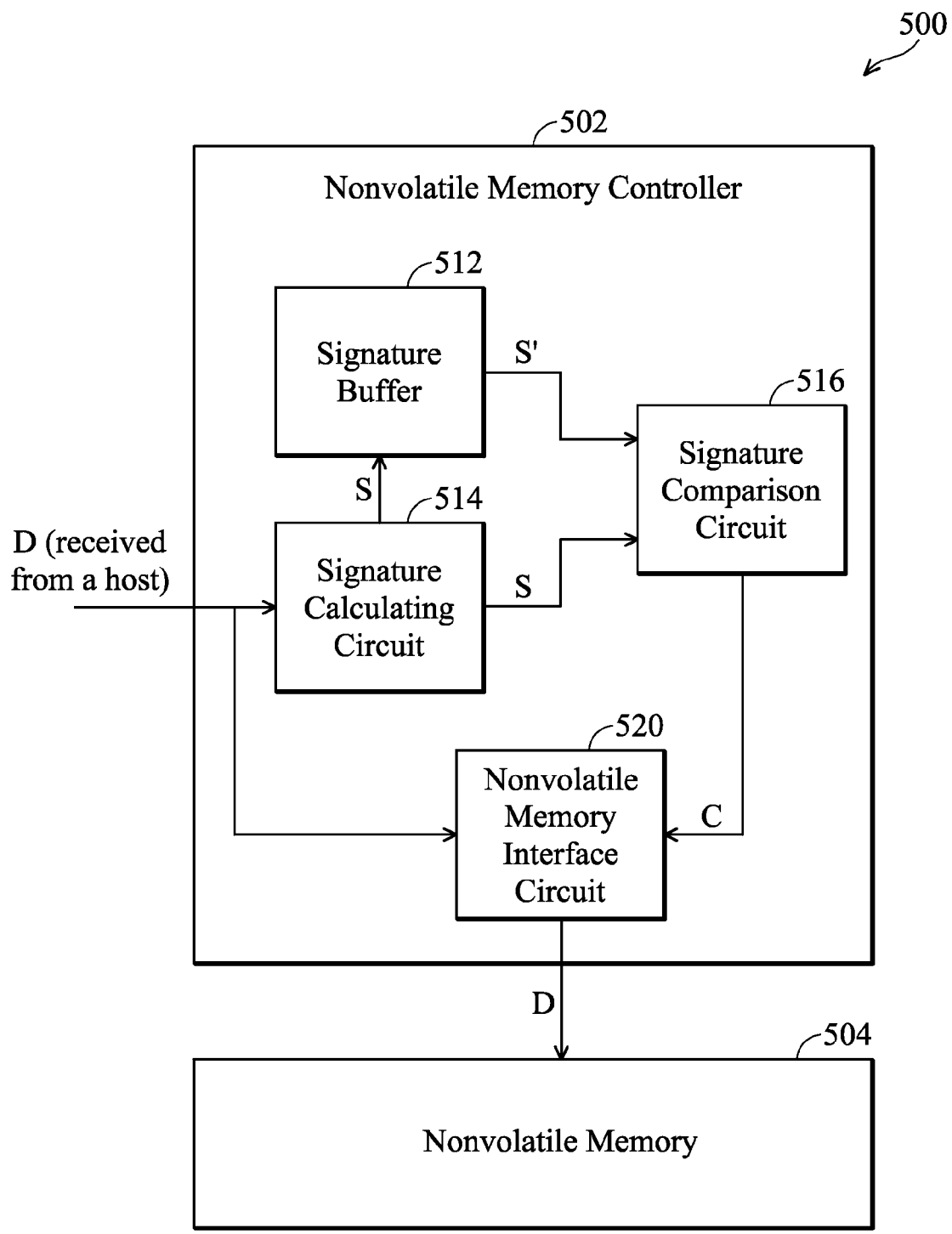
FIG. 5 is a block diagram of another embodiment of a memory device according to the invention.
Figure 6:
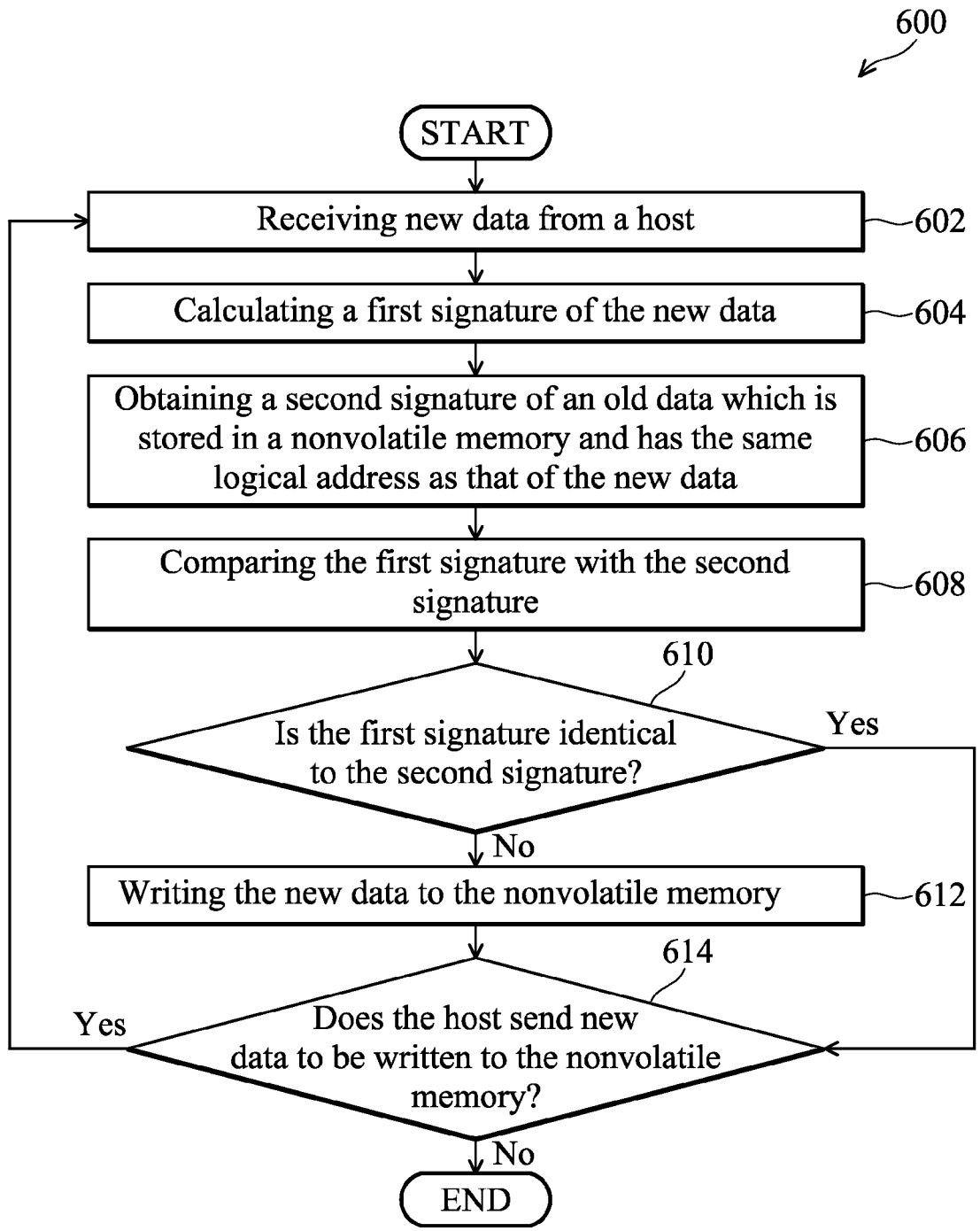
FIG. 6 is a flowchart of another embodiment of a method for writing new data to a nonvolatile memory according to the invention.

Referring to FIG. 5, a block diagram of another embodiment of a memory device 500 according to the invention is shown. The memory device 500 comprises a nonvolatile memory controller 502 and a nonvolatile memory 504. The nonvolatile memory controller 502 is roughly the same as the nonvolatile memory controller 302 shown in FIG. 3 except that the nonvolatile memory controller 502 does not comprise a data comparison circuit 318. In one embodiment, the nonvolatile memory controller 502 comprises a signature buffer 512, a signature calculating circuit 514, a signature comparison circuit 516, and a nonvolatile memory interface circuit 520. Referring to FIG. 6, a flowchart of another embodiment of a method 600 for writing new data to a nonvolatile memory 504 according to the invention is shown, and the nonvolatile memory controller 502 operates according to the method 600.

When the nonvolatile memory controller 502 receives new data D from a host (step 602), the signature calculating circuit 514 calculates a first signature S of the new data D (step 604). The signature buffer 512 stores a plurality of signatures corresponding to data stored in the nonvolatile memory 504. The signature buffer 512 selects a second signature S' from the signatures stored therein according to a logical address of the new data D, and outputs the second signature S' (step 606), wherein the second signature S' corresponds to old data D' stored in the nonvolatile memory 504, and the old data D' has the same logical address as that of the new data D.

The signature comparison circuit 608 then compares the first signature S with the second signature S' to determine whether the first signature S is identical to the second signature S' (step 608). If the first signature S is different from the second signature S' (step 610), the signature comparison circuit 516 generates a comparison result signal C to direct the nonvolatile memory interface circuit 520 to write the new data D to the nonvolatile memory 504 (step 612). If the first signature S is identical to the second signature S' (step 610), writing of the new data D is skipped. Thus, only when the first signature S is determined to be different from the second signature S' by the signature comparison circuit 516, the nonvolatile memory interface circuit 520 writes the new data D to the nonvolatile memory 504. The nonvolatile memory controller 502 continues to perform steps 602-614, only when the host continues to send new data to be written to the nonvolatile memory 504.

Figure 7:
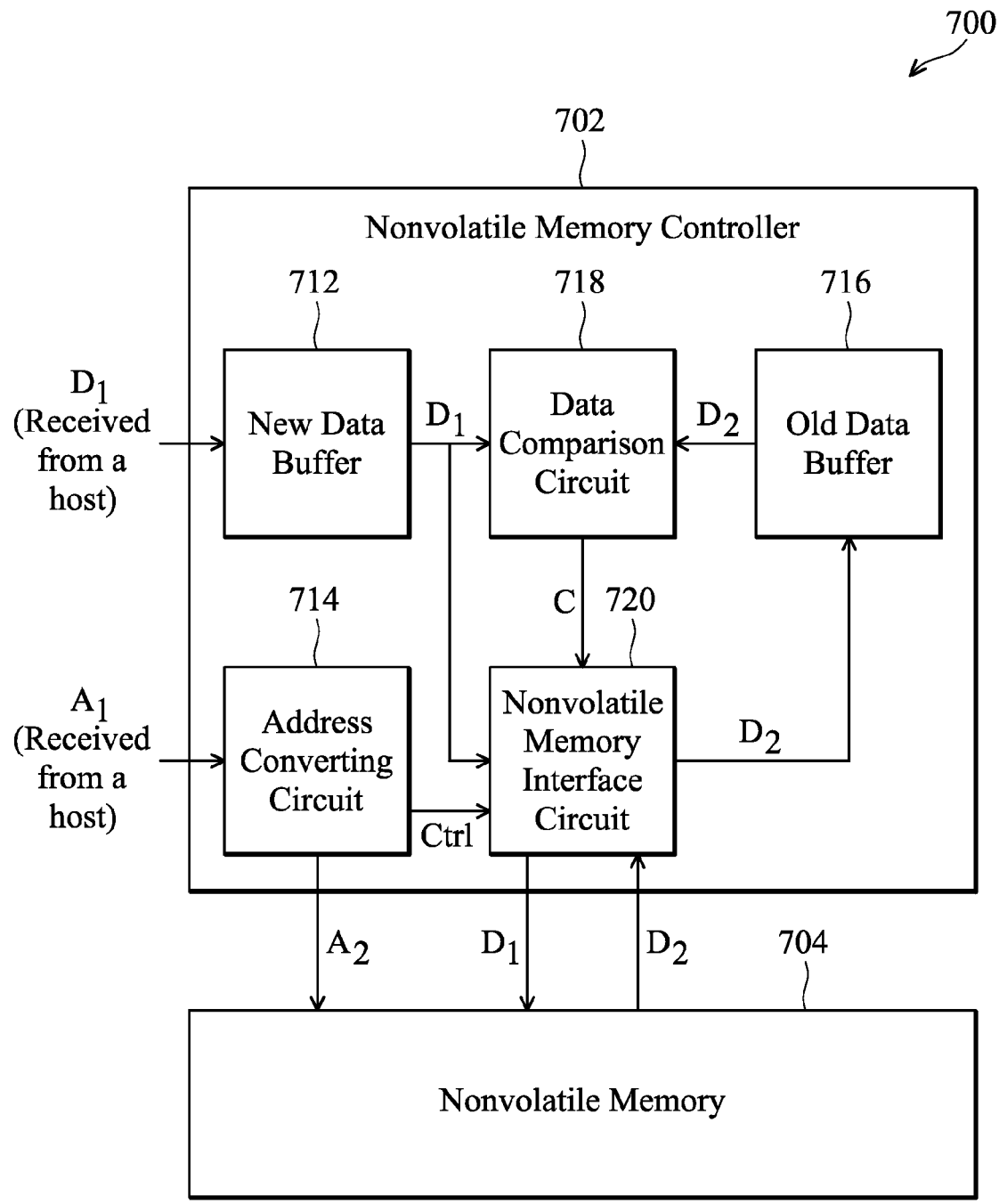
FIG. 7 is a block diagram of another embodiment of a memory device according to the invention.
Figure 8:
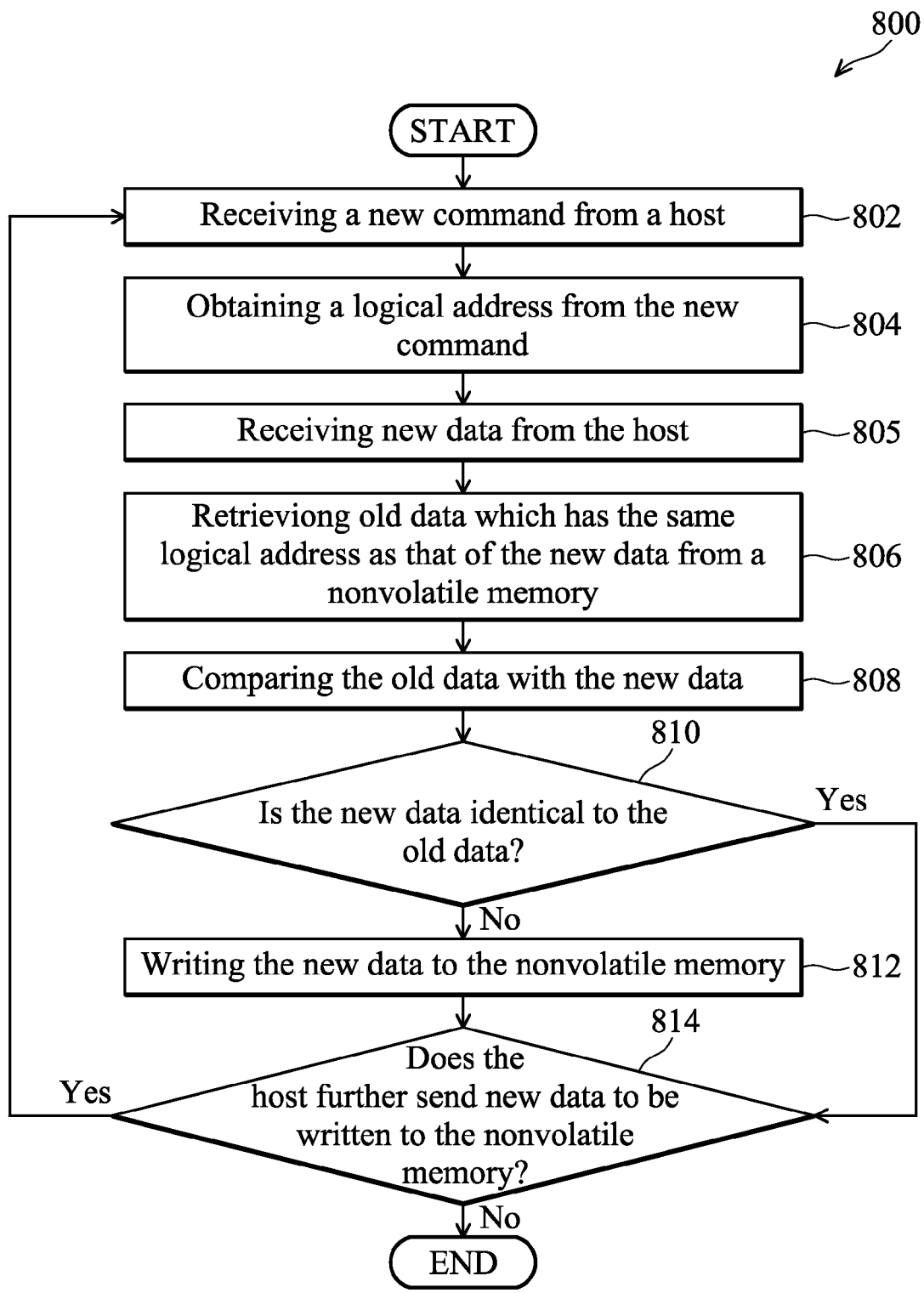
FIG. 8 is a flowchart of another embodiment of a method for writing new data to a nonvolatile memory according to the invention.

Referring to FIG. 7, a block diagram of another embodiment of a memory device 700 according to the invention is shown. The memory device 700 comprises a nonvolatile memory controller 702 and a nonvolatile memory 704. The nonvolatile memory 704 stores data. The nonvolatile memory controller 702 is coupled between a host and the nonvolatile memory 704 and accesses the data stored in the nonvolatile memory 704 according to instructions from the host. In one embodiment, the nonvolatile memory controller 702 comprises a new data buffer 712, an address converting circuit 714, an old data buffer 716, a data comparison circuit 718, and a nonvolatile memory interface circuit 720. Referring to FIG. 8, a flowchart of another embodiment of a method 800 for writing new data to the nonvolatile memory 704 according to the invention is shown, and the nonvolatile memory controller 702 operates according to the method 800.

First, the nonvolatile memory controller 702 obtains a logical address $A_1$ of the new data $D_1$ from the host (step 804). The nonvolatile memory controller 702 then receives new data $D_1$ to be written to the nonvolatile memory 704 from the host (step 802), and stored the new data $D_1$ in the new data buffer 712. The nonvolatile memory controller 702 then retrieves old data $D_2$ which has the same logical address $A_1$ as that of the new data $D_1$ from the nonvolatile memory 704 via the nonvolatile memory interface circuit 720 (step 806), and then stores the old data $D_2$ in the old data buffer 716. In one embodiment, the address converting circuit 714 determines a physical address $A_2$ corresponding to the logical address $A_1$, and the nonvolatile memory interface circuit 720 then directs the nonvolatile memory 704 to retrieve the old data $D_2$ from the nonvolatile memory 704 according to the physical address $A_2$.

The data comparison circuit 718 then compares the new data $D_1$ stored in the new data buffer 712 with the old data $D_2$ stored in the old data buffer 716 (step 808). If the data comparison circuit 718 determines that the new data $D_1$ is identical to the old data $D_2$, the nonvolatile memory controller 702 does not write the new data $D_1$ to the nonvolatile memory 704, and the new data buffer 712 erases the new data $D_1$ stored therein. If the data comparison circuit 718 determines that the new data $D_1$ is different from the old data $D_2$, the data comparison circuit 718 sends a control signal C to the nonvolatile memory interface circuit 720, and the nonvolatile memory interface circuit 720 directs the nonvolatile memory 704 to write the new data $D_1$ to the nonvolatile memory 704 (step 812). The nonvolatile memory controller 702 continues to perform steps 802-812, only when the host continues to send new data to be written to the nonvolatile memory 704.

Figure 9A:
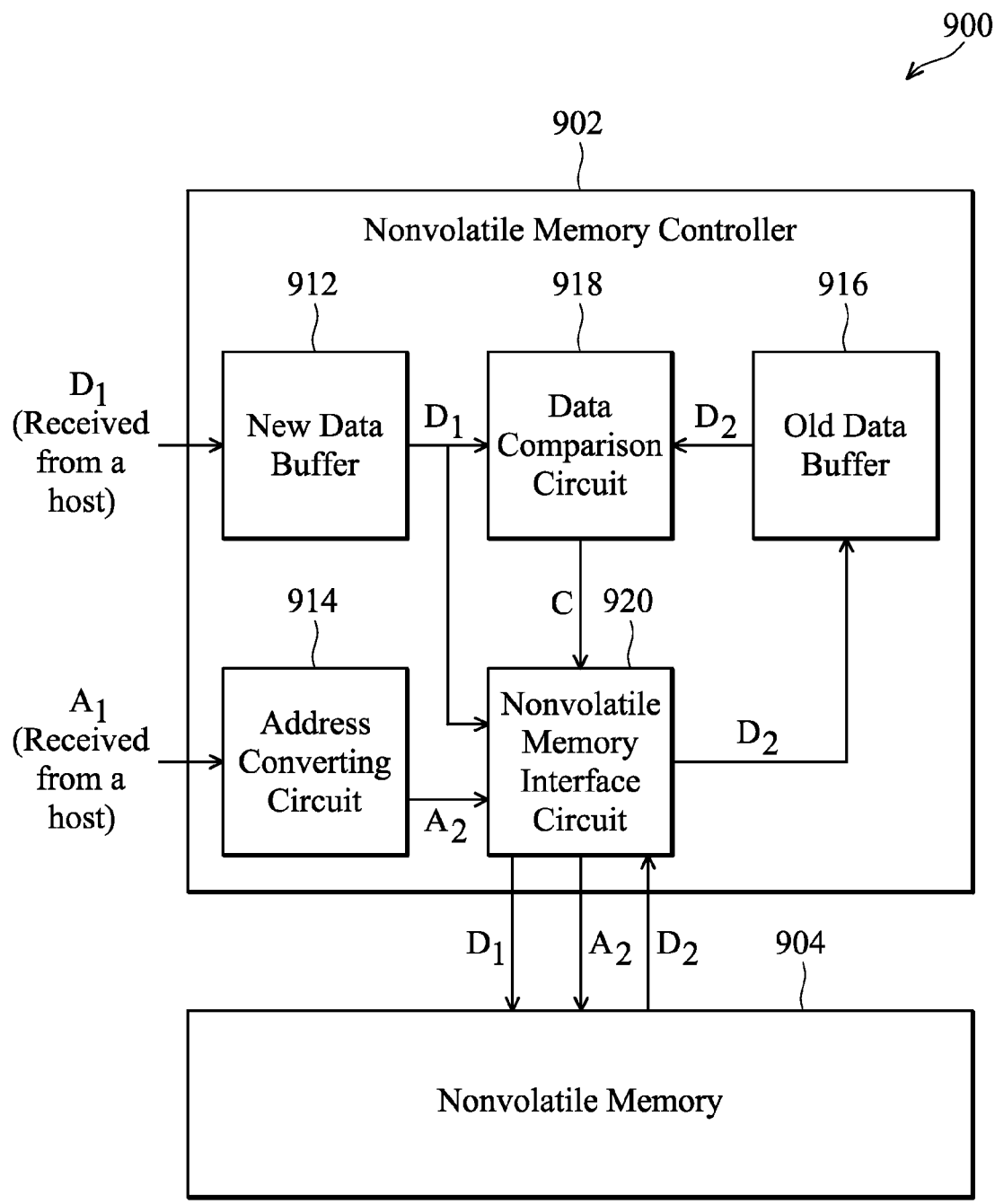
FIG. 9A is a block diagram of another embodiment of a nonvolatile memory device according to the invention.

The nonvolatile memory controller 702 of the nonvolatile memory device 700 shown in FIG. 7 may have other kinds of circuit structures. Referring to FIG. 9A, a block diagram of another embodiment of a nonvolatile memory device 900 according to the invention is shown. Similar to the nonvolatile memory controller 702, the nonvolatile memory controller 902 comprises a new data buffer 912, an old data buffer 916, an address converting circuit 914, a data comparison circuit 918, and a nonvolatile memory interface circuit 920. The address converting circuit 714 determines a physical address $A_2$ corresponding to the logical address $A_1$, and sends the physical address A2 to the nonvolatile memory interface circuit 920. The nonvolatile memory interface circuit 920 then directs the nonvolatile memory 904 to retrieve the old data $D_2$ from the nonvolatile memory 904 according to the physical address $A_2$. The new data buffer 912, the old data buffer 916, and the data comparison circuit 918 have the same functions as the corresponding circuits 712, 716, and 718 shown in FIG. 7.

Figure 9B:
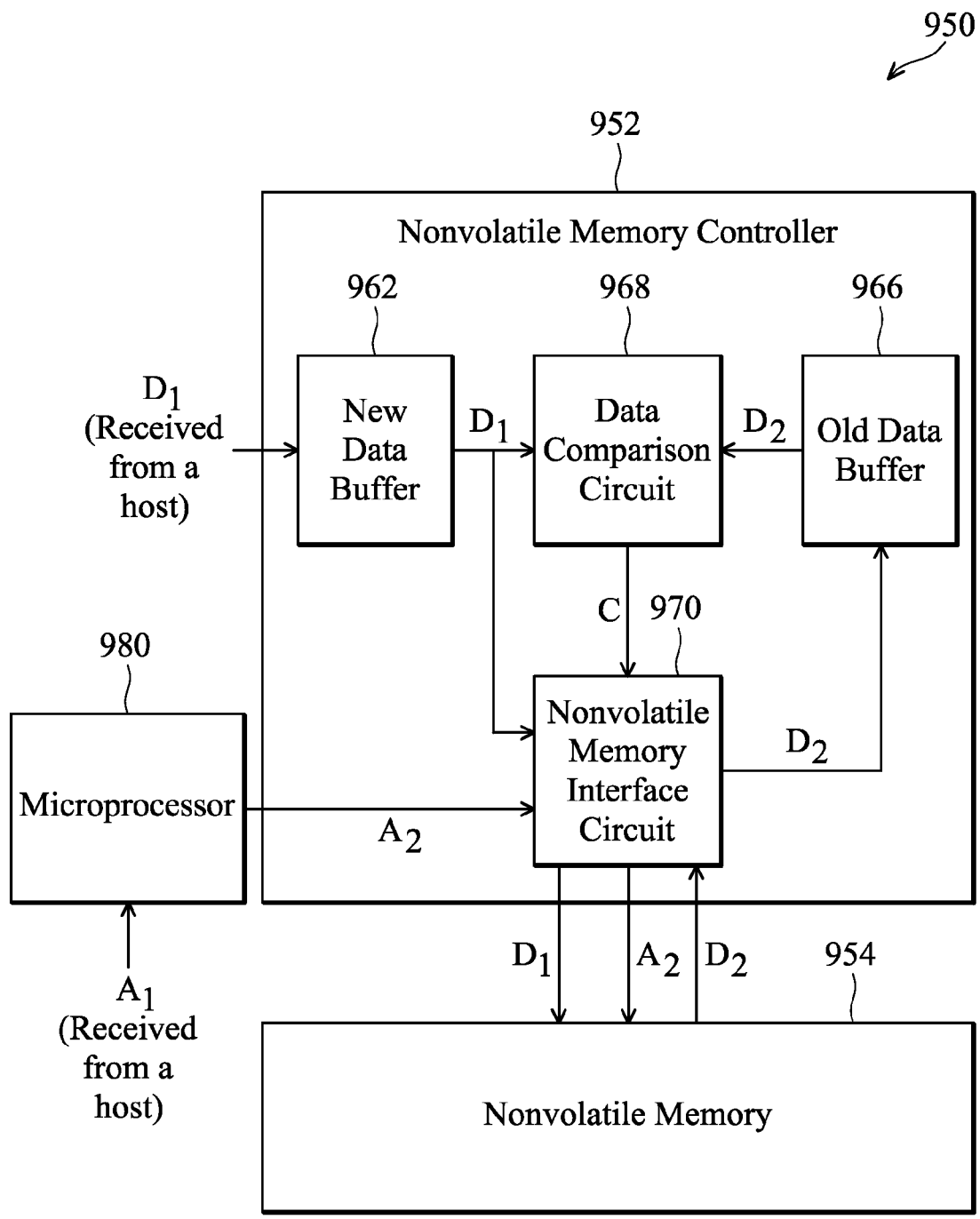
FIG. 9B is a block diagram of another embodiment of a nonvolatile memory device according to the invention.

Referring to FIG. 9B, a block diagram of another embodiment of a nonvolatile memory device 950 according to the invention is shown. In addition to a nonvolatile memory controller 952 and a nonvolatile memory 954, the nonvolatile memory device 950 further comprises a microprocessor 980. The nonvolatile memory controller 952 comprises a new data buffer 912, an old data buffer 916, a data comparison circuit 918, and a nonvolatile memory interface circuit 920, but lacks an address converting circuit for address conversion. When the nonvolatile memory device 950 receives a logical address $A_1$ from a host, the logical address $A_1$ is sent to the microprocessor 980. The microprocessor 980 then determines a physical address $A_2$ corresponding to the logical address $A_1$, and sends the physical address A2 to the nonvolatile memory interface circuit 970 of the nonvolatile memory controller 952. The nonvolatile memory interface circuit 970 then directs the nonvolatile memory 954 to retrieve the old data $D_2$ from the nonvolatile memory 954 according to the physical address $A_2$. The new data buffer 962, the old data buffer 966, and the data comparison circuit 968 have the same functions as the corresponding circuits 712, 716, and 718 shown in FIG. 7.

Figure 10:
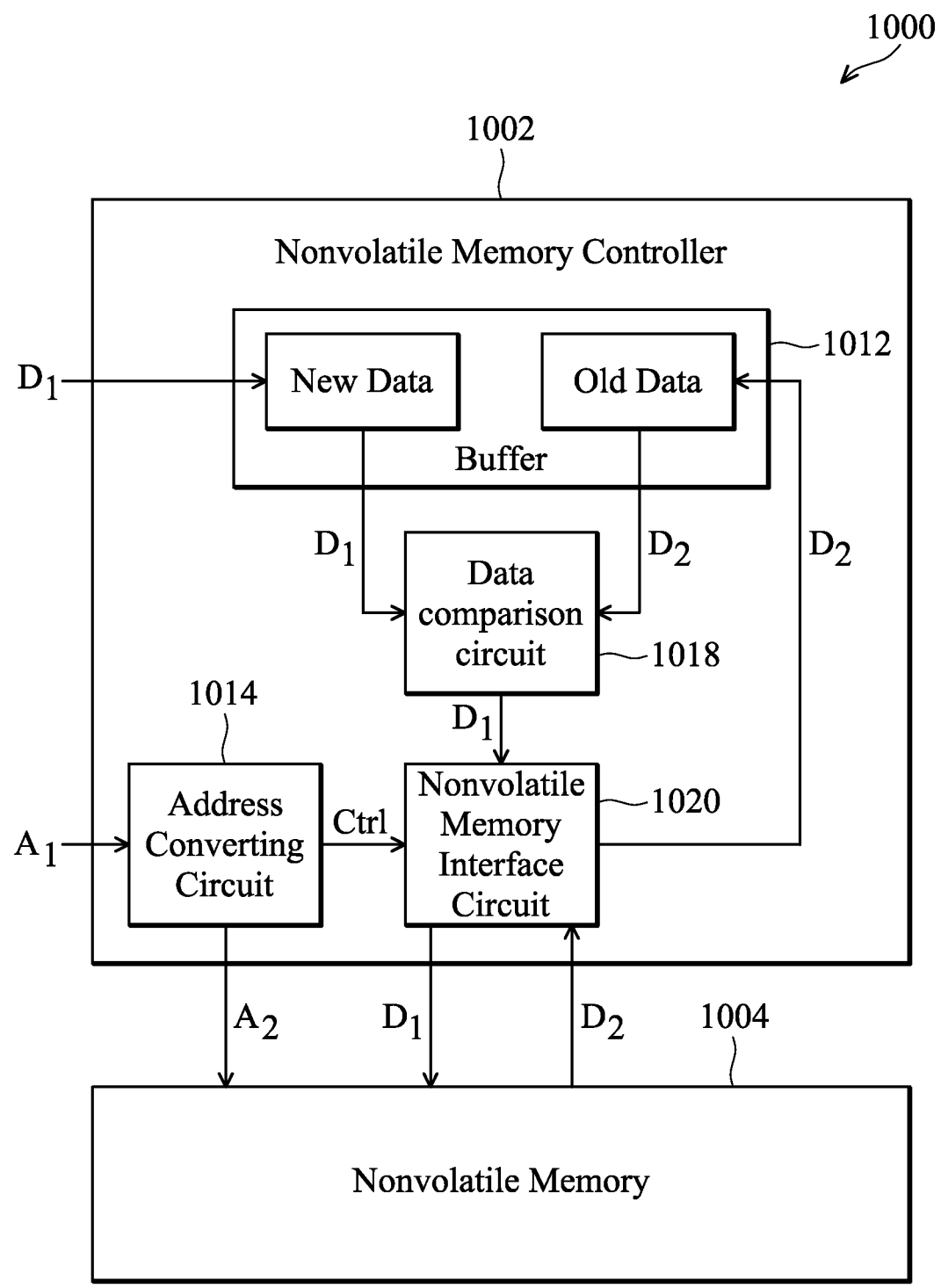
FIG. 10 is a block diagram of another embodiment of a nonvolatile memory device 1000 according to the invention.

Referring to FIG. 10, a block diagram of another embodiment of a nonvolatile memory device 1000 according to the invention is shown. The nonvolatile memory device 1000 comprises a nonvolatile memory controller 1002 and a nonvolatile memory 1004. The nonvolatile memory controller 902 comprises a buffer 1012, an address converting circuit 1014, a data comparison circuit 1018, and a nonvolatile memory interface circuit 1020. When the nonvolatile memory controller 1002 receives new data $D_1$ to be written to the nonvolatile memory 1004 from the host, the new data $D_1$ is stored in the buffer 1012. When the nonvolatile memory controller 1002 retrieves old data $D_2$ which has the same logical address $A_1$ as that of the new data $D_1$ from the nonvolatile memory 1004 via the nonvolatile memory interface circuit 1020, and the old data $D_2$ is also stored in the buffer 1012. The address converting circuit 1014, the data comparison circuit 1018, and the nonvolatile memory interface circuit 1020 have the same functions as the corresponding circuits 714, 718, and 720 shown in FIG. 7.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A nonvolatile memory controller, receiving new data for writing a nonvolatile memory from a host, comprising:
   a signature calculating circuit, calculating a first signature according to the new data;
   a signature buffer, storing a plurality of signatures corresponding to data stored in the nonvolatile memory, and outputting a second signature corresponding to old data stored in the nonvolatile memory, wherein the old data has the same logical address as that of the new data;
   a signature comparison circuit, directly retrieving the second signature from the signature buffer without communicating through a nonvolatile memory interface circuit, and determining whether the first signature is identical to the second signature;
   a data comparison circuit, determining whether the new data is the same as the old data when the first signature is identical to the second signature; and
   the nonvolatile memory interface circuit, writing the new data to the nonvolatile memory when the first signature is determined to be different from the second signature by the signature comparison circuit or when the new data is determined to be different from the old data by the data comparison circuit.

2. The nonvolatile memory controller as claimed in claim 1, wherein when the data comparison circuit determines that the new data is the same as the old data, the nonvolatile memory interface circuit does not write the new data to the nonvolatile memory.

3. The nonvolatile memory controller as claimed in claim 1, wherein the signature buffer stores the plurality of signatures according to logical addresses of the data stored in the nonvolatile memory, and selects the second signature corresponding to the old data from the plurality of signatures according to the logical address of the new data.

4. The nonvolatile memory controller as claimed in claim 1, wherein the first signature, the second signature, and the plurality of signatures are respectively checksums of the new data, the old data, and the data stored in the nonvolatile memory.

5. The nonvolatile memory controller as claimed in claim 1, wherein the first signature, the second signature, and the plurality of signatures are respectively error correction codes of the new data, the old data, and the data stored in the nonvolatile memory.

6. The nonvolatile memory controller as claimed in claim 3, wherein after the nonvolatile memory interface circuit writes the new data to the nonvolatile memory, the first signature calculated by the signature calculating circuit is stored into the signature buffer according to the logical address of the new data.

7. A method for writing new data to a nonvolatile memory, comprising:
   receiving the new data from a host;
   calculating a first signature according to the new data;
   obtaining a second signature corresponding to old data stored in the nonvolatile memory directly from a signature buffer of a nonvolatile memory controller without communicating through a nonvolatile memory interface circuit, wherein the old data has the same logical address as that of the new data, and the signature buffer stores a plurality of signatures corresponding to data stored in the nonvolatile memory;
   determining whether the first signature is identical to the second signature;

determining whether the new data is the same as the old data when the first signature is identical to the second signature; and writing the new data to the nonvolatile memory when the first signature is determined to be different from the second signature or when the new data is determined to be different from the old data.

8. The method as claimed in claim 7, wherein the signature buffer stores the plurality of signatures according to logical address of the data stored in the nonvolatile memory, and obtaining of the second signature comprises selecting the second signature from the plurality of signatures according to the logical address of the new data.

9. The method as claimed in claim 7, wherein the method further comprises skipping writing of the new data to the nonvolatile memory when the new data is determined to be the same as the old data.

10. The method as claimed in claim 7, wherein the first signature, the second signature, and the plurality of signatures are respectively checksums of the new data, the old data, and the data stored in the nonvolatile memory.

11. The method as claimed in claim 7, wherein the first signature, the second signature, and the plurality of signatures are respectively error correction codes of the new data, the old data, and the data stored in the nonvolatile memory.

12. The method as claimed in claim 8, wherein the method further comprises storing the first signature to the signature buffer according to the logical address of the new data after the nonvolatile memory interface circuit writes the new data to the nonvolatile memory.

13. A nonvolatile memory controller, receiving new data for writing a nonvolatile memory from a host, comprising:
a signature calculating circuit, calculating a first signature according to the new data;
a signature buffer, storing a plurality of signatures corresponding to data stored in the nonvolatile memory, outputting a second signature corresponding to old data stored in the nonvolatile memory, wherein the old data has the same logical address as that of the new data;
a signature comparison circuit, directly retrieving the second signature from the signature buffer without communicating through a nonvolatile memory interface circuit, and determining whether the first signature is identical to the second signature; and
the nonvolatile memory interface circuit, writing the new data to the nonvolatile memory when the first signature is determined to be different from the second signature by the signature comparison circuit.

14. The nonvolatile memory controller as claimed in claim 13, wherein when the signature comparison circuit determines that the first signature is identical to the second signature, the nonvolatile memory interface circuit does not write the new data to the nonvolatile memory.

15. The nonvolatile memory controller as claimed in claim 13, wherein the signature buffer stores the plurality of signatures according to logical address of the data stored in the nonvolatile memory, and selects the second signature corresponding to the old data from the plurality of signatures according to the logical address of the new data.

16. The nonvolatile memory controller as claimed in claim 13, wherein the first signature, the second signature, and the plurality of signatures are respectively checksums of the new data, the old data, and the data stored in the nonvolatile memory.

17. The nonvolatile memory controller as claimed in claim 13, wherein the first signature, the second signature, and the plurality of signatures are respectively error correction codes of the new data, the old data, and the data stored in the nonvolatile memory.

18. The nonvolatile memory controller as claimed in claim 15, wherein after the nonvolatile memory interface circuit writes the new data to the nonvolatile memory, the first signature calculated by the signature is stored into the signature buffer according to the logical address of the new data.

19. A method for writing new data to a nonvolatile memory, comprising:
receiving the new data from a host;
retrieving old data which has the same logical address as that of the new data from a memory;
storing the old data into an old data buffer of a nonvolatile memory controller;
obtaining the old data directly from the old data buffer without communicating through a nonvolatile memory interface circuit;
comparing the new data with the old data stored in the old data buffer; and
when the new data is different from the old data, writing the new data to the memory.

20. The method as claimed in claim 19, wherein retrieving of the old data further comprises:
obtaining a logical address of the new data;
determining a physical address corresponding to the logical address; and
retrieving the old data from the memory according to the physical address.

21. The method as claimed in claim 19, wherein the method further comprises:
when the new data is the same as the old data, clearing a buffer holding the new data without writing the new data to the memory.

22. A nonvolatile memory controller, receiving new data for writing a nonvolatile memory from a host, comprising:
a new data buffer, storing the new data;
an old data buffer, storing old data retrieved from the nonvolatile memory, wherein the old data has the same logical address as that of the new data;
a data comparison circuit, directly retrieving the new data from the new data buffer and the old data from the old data buffer without communicating through a nonvolatile memory interface circuit, and comparing the old data with the new data to determine whether the new data is the same as the old data; and
the nonvolatile memory interface circuit, writing the new data to the nonvolatile memory when the new data is different from the old data.

23. The nonvolatile memory controller as claimed in claim 22, wherein the nonvolatile memory controller further comprises:
an address converting circuit, determining a physical address corresponding to a logical address of the new data;
wherein the nonvolatile memory controller further directs the memory to retrieve the old data from the memory according to the physical address.

24. The nonvolatile memory controller as claimed in claim 22, wherein the nonvolatile memory interface circuit does not write the new data to the nonvolatile memory when the new data is the same as the old data.

* * * * *